United States Patent
Lee et al.

(10) Patent No.: US 12,477,729 B2
(45) Date of Patent: Nov. 18, 2025

(54) CMOS DEVICE, METHOD OF MANUFACTURING CMOS DEVICE, AND SEMICONDUCTOR MEMORY DEVICE INCLUDING CMOS DEVICE

(71) Applicant: SK hynix Inc., Icheon-si (KR)

(72) Inventors: Dong Uk Lee, Icheon-si (KR); Hae Chang Yang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 343 days.

(21) Appl. No.: 18/113,543

(22) Filed: Feb. 23, 2023

(65) Prior Publication Data

US 2024/0074175 A1  Feb. 29, 2024

(30) Foreign Application Priority Data

Aug. 31, 2022 (KR) .................. 10-2022-0109939

(51) Int. Cl.
*H10B 41/41* (2023.01)
*H10B 41/27* (2023.01)
(Continued)

(52) U.S. Cl.
CPC ............ *H10B 41/41* (2023.02); *H10B 41/27* (2023.02); *H10B 41/35* (2023.02); *H10B 43/27* (2023.02);
(Continued)

(58) Field of Classification Search
CPC .. H10D 84/08; H10D 84/0167; H10D 84/038; H10D 84/02; H10B 43/40; H10B 43/35; H10B 43/27; H10B 41/27
(Continued)

(56) References Cited

U.S. PATENT DOCUMENTS 9,397,095 B1 * 7/2016 Cheng .................. H10D 89/10
2007/0145388 A1 * 6/2007 Philippens ............ B82Y 20/00
257/86
(Continued)

FOREIGN PATENT DOCUMENTS

KR    1020210152310 A    12/2021

OTHER PUBLICATIONS

A. Mahmoodinezhad et al., "Low-temperature growth of gallium oxide thin films by plasma-enhanced atomic layer deposition", J. Vac. Sci. Technol. A 38, 022404 (2020).
(Continued)

*Primary Examiner* — Norman D Richards
(74) *Attorney, Agent, or Firm* — WILLIAM PARK AND ASSOCIATES LTD.

(57) ABSTRACT

A CMOS device, and a method of manufacturing the same, includes a semiconductor substrate and a trench formed in the semiconductor substrate. The CMOS device also includes an oxide semiconductor layer disposed in the trench, the oxide semiconductor layer including a source region, a drain region, and a channel region between the source region and the drain region. The CMOS device further includes a buffer layer between the oxide semiconductor layer and the semiconductor substrate, a gate insulating layer on the oxide semiconductor layer, a gate electrode disposed on the gate insulating layer over the channel region of the oxide semiconductor layer, and impurities distributed in each of the source region and the drain region of the oxide semiconductor layer.

22 Claims, 10 Drawing Sheets

(51) Int. Cl.
  *H10B 41/35* (2023.01)
  *H10B 43/27* (2023.01)
  *H10B 43/35* (2023.01)
  *H10B 43/40* (2023.01)
  *H10D 84/01* (2025.01)
  *H10D 84/03* (2025.01)
  *H10D 84/85* (2025.01)

(52) U.S. Cl.
  CPC ............ *H10B 43/35* (2023.02); *H10B 43/40* (2023.02); *H10D 84/0167* (2025.01); *H10D 84/017* (2025.01); *H10D 84/0188* (2025.01); *H10D 84/038* (2025.01); *H10D 84/85* (2025.01)

(58) Field of Classification Search
  USPC ......................................................... 257/613
  See application file for complete search history.

(56) References Cited

U.S. PATENT DOCUMENTS

| | | | | |
|---|---|---|---|---|
| 2013/0221356 | A1* | 8/2013 | Yamazaki | H10D 88/00 257/296 |
| 2014/0077305 | A1* | 3/2014 | Pethe | H01L 21/76895 257/E21.409 |
| 2017/0125530 | A1* | 5/2017 | Zhang | H10D 64/01 |
| 2019/0165178 | A1* | 5/2019 | Chen | H01L 23/535 |
| 2020/0312961 | A1* | 10/2020 | Then | H10D 30/475 |
| 2021/0057417 | A1* | 2/2021 | Cho | H10B 12/488 |
| 2021/0335995 | A1 | 10/2021 | Oshima et al. | |
| 2021/0367080 | A1* | 11/2021 | Lee | H10D 30/0415 |
| 2022/0173099 | A1* | 6/2022 | Kim | H10D 88/00 |
| 2023/0097393 | A1* | 3/2023 | Cho | H10D 87/00 257/43 |
| 2023/0292490 | A1* | 9/2023 | Lee | H10B 12/315 |
| 2023/0335550 | A1* | 10/2023 | Heo | H01L 21/02568 |

OTHER PUBLICATIONS

Chao-Chun Yen et al., "Role of Interfacial Oxide in the Preferred Orientation of Ga2O3 on Si for Deep Ultraviolet Photodetectors", ACS Omega 6, pp. 29149-29156, (2021).

Hsien-Chih Huang et al., "High Aspect Ratio β-Ga2O3 Fin Arrays with Low-Interface Charge Density by Inverse Metal-Assisted Chemical Etching", ACS Nano 13, pp. 8784-8792, (2019).

J. B. Varley et al., "Oxygen vacancies and donor impurities in β-Ga2O3", Applied Physics Letters, 97, 142106 (2010).

K. D. Chabak et al., "Lateral β-Ga2O3 field effect transistors", Semicond. Sci. Technol. 35, 013002 (2020).

S. J. Pearton et al., "A review of Ga2O3 materials, processing, and devices", Applied Physics Reviews 5, 011301 (2018).

S. J. Pearton et al., "Perspective: Ga2O3 for ultra-high power rectifiers and MOSFETS", Journal of Applied Physics, 124, 220901 (2018).

T. Hadamek et al., "β-Ga2O3 on Si (001) grown by plasma assisted MBE with γ-Al2O3 (111) buffer layer: Structural characterization", AIP Advances 11, 045209 (2021).

* cited by examiner

CMOS DEVICE, METHOD OF MANUFACTURING CMOS DEVICE, AND SEMICONDUCTOR MEMORY DEVICE INCLUDING CMOS DEVICE

CROSS-REFERENCE TO RELATED APPLICATION

The present application claims priority under 35 U.S.C. § 119(a) to Korean patent application number 10-2022-0109939, filed on Aug. 31, 2022, in the Korean Intellectual Property Office, the entire disclosure of which is incorporated herein by reference.

BACKGROUND

1. Technical Field

Various embodiments of the present disclosure generally relate to an electronic device including a transistor, and more particularly to a complementary metal oxide semiconductor (CMOS) device, a method of manufacturing the CMOS device, and a semiconductor memory device including the CMOS device.

2. Related Art

Semiconductor memory devices are roughly classified as volatile memory devices or nonvolatile memory devices.

A nonvolatile memory device may retain stored data even when supplied power is interrupted. Nonvolatile memory devices use nonvolatile memory. Examples of nonvolatile memory include read-only memory (ROM), mask ROM (MROM), programmable ROM (PROM), erasable programmable ROM (EPROM), electrically erasable programmable ROM (EEPROM), flash memory, phase-change random access memory (PRAM), magnetic RAM (MRAM), resistive RAM (RRAM), ferroelectric RAM (FRAM), etc, Flash memory is classified as NOR type or NAND type.

The operation of a NAND flash memory cell may be controlled through a peripheral circuit structure. The peripheral circuit structure may include a complementary metal oxide semiconductor (CMOS) structure to control various operations such as a program operation, a read operation, and an erase operation of the NAND flash memory. The CMOS structure provided as the peripheral circuit structure may include high-voltage transistors and low-voltage transistors, Of these transistors, at least one high-voltage transistor needs to be able to stably provide a high voltage required for a program operation and an erase operation.

SUMMARY

In accordance with an embodiment of the present disclosure is a complementary metal oxide semiconductor (CMOS) device. The CMOS device may include a semiconductor substrate; a trench formed in the semiconductor substrate; an oxide semiconductor layer disposed in the trench, the oxide semiconductor layer including a source region, a drain region, and a channel region between the source region and the drain region; a buffer layer between the oxide semiconductor layer and the semiconductor substrate; a gate insulating layer on the oxide semiconductor layer; a gate electrode disposed on the gate insulating layer over the channel region of the oxide semiconductor layer; and impurities distributed in each of the source region and the drain region of the oxide semiconductor layer.

In accordance with an embodiment of the present disclosure is a semiconductor memory device. The semiconductor memory device may include a peripheral circuit structure including a transistor aligned in a trench in a semiconductor substrate; a conductive first connection structure coupled to the peripheral circuit structure and including a first bonding pad; a conductive second connection structure including a second bonding pad coupled to the first bonding pad; and a memory cell array coupled to the conductive second connection structure. The transistor may include an oxide semiconductor layer disposed in the trench, the oxide semiconductor layer including a source region, a drain region, and a channel region between the source region and the drain region; a buffer layer between the oxide semiconductor layer and the semiconductor substrate; a gate insulating layer on the oxide semiconductor layer; a gate electrode disposed on the gate insulating layer over the channel region of the oxide semiconductor layer; and impurities distributed in each of the source region and the drain region of the oxide semiconductor layer.

In accordance with an embodiment of the present disclosure is a method of manufacturing a CMOS device. The method may include forming a trench in a first area of a semiconductor substrate including the first area and a second area; forming a buffer layer along a surface of the trench; forming an oxide semiconductor layer on the buffer layer in the trench, the oxide semiconductor layer including a source region, a drain region, and a channel region between the source region and drain region; forming a gate insulating layer on the oxide semiconductor layer; implanting impurities into the source region and the drain region of the oxide semiconductor layer; and forming a gate electrode on the gate insulating layer over the channel region of the oxide semiconductor layer.

DETAILED DESCRIPTION

The specific structural and functional descriptions disclosed herein are merely illustrative for the purpose of describing embodiments according to the concept of the present disclosure. The embodiments according to the concept of the present disclosure can be modified in various forms and replaced with other equivalent embodiments. Thus, the present disclosure should not be construed as being limited to the embodiments set forth herein.

It will be understood that, although the terms "first," "second," etc. may be used herein to describe various elements, these elements should not be limited by these terms. These terms are only used to distinguish one element from another element, and the order or number of components is not limited by the terms.

Figure 1:
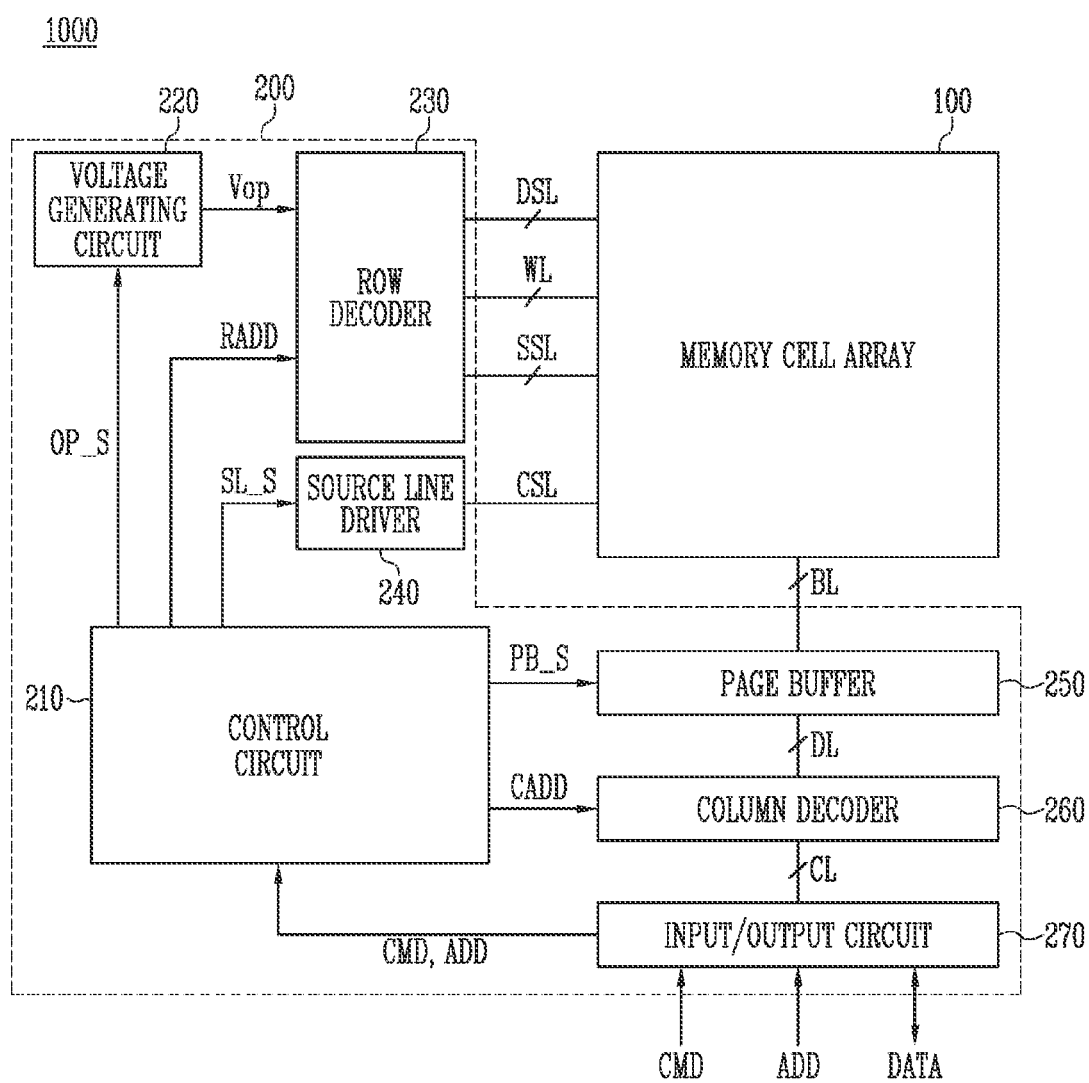
FIG. 1 is a block diagram illustrating a semiconductor memory device according to an embodiment of the present disclosure.

Embodiments of the present disclosure are directed to a CMOS device having improved operational reliability, a method of manufacturing the CMOS device, and a semiconductor memory device including the CMOS device, FIG. 1 is a block diagram illustrating a semiconductor memory device according to an embodiment of the present disclosure.

Referring to FIG. 1, a semiconductor memory device 1000 may include a peripheral circuit structure 200 and a memory cell array 100.

The peripheral circuit structure 200 may perform a program operation of storing data in the memory cell array 100, a read operation of outputting data stored in the memory cell array 100, and an erase operation of erasing data stored in the memory cell array 100. In an embodiment, the peripheral circuit structure 200 may include a control circuit 210, a voltage generating circuit 220, a row decoder 230, a source line driver 240, a page buffer 250, a column decoder 260, and an input/output circuit 270.

The memory cell array 100 may include a plurality of memory cells in which data is stored. In an embodiment, each memory cell may have a NAND flash structure. The plurality of memory cells in the memory cell array may be arranged in a two-dimensional (2D) or three-dimensional (3D) structure. The memory cell array having a 3D structure may include a plurality of memory cells that are stacked to be spaced apart from each other between a source structure and a bit line. The memory cell array 100 may be coupled to a drain select line DSL, a plurality of word lines WL, a source select line SSL, a plurality of bit lines BL, and a common source line CSL.

The control circuit 210 may output an operation signal OP_S, a row address RADD, a source line control signal SL_S, a page buffer control signal PB_S, and a column address CADD in response to a command CMD and an address ADD.

The voltage generating circuit 220 may generate various operating voltages Vop to be used for a program operation, a read operation, and an erase operation in response to the operation signal OP_S.

The row decoder 230 may transfer the operating voltages Vop to the drain select line DSL, the word lines WL, and the source select line SSL in response to the row address RADD.

The source line driver 240 may control a voltage that is applied to the common source line CSL in response to the source line control signal SL_S.

The page buffer 250 lay temporarily store data DATA received through the bit lines BL or data lines DL in response to the page buffer control signal PB_S. During a read operation, the page buffer 250 may store data DATA by sensing the voltages or currents of the bit lines BL. During a program operation, the page buffer 250 may store data DATA received through the data lines DL, and may apply a program-enable voltage or a program-inhibit voltage to the bit lines BL depending on the stored data DATA.

The column decoder 260 may transmit data DATA, received from the input/output circuit 270, to the page buffer 250 or transmit data DATA, stored in the page buffer 250, to the input/output circuit 270 in response to the column address CADD, The column decoder 260 may exchange the data DATA with the input/output circuit 270 through column lines CL, The column decoder 260 may exchange the data DATA with the page buffer 250 through data lines DL.

The input/output circuit 270 may transfer a command CMD and an address ADD, received from an external device (e.g., a memory controller) of the semiconductor memory device 1000, to the control circuit 210. The input/output circuit 270 may exchange data DATA with the external device and the column decoder 260.

To improve the degree of integration of the semiconductor memory device, the memory cell array 100 may overlap the peripheral circuit structure 200.

The peripheral circuit structure 200 may be a complementary metal oxide semiconductor (CMOS) device, and may include a high-voltage transistor and a low-voltage transistor. In an embodiment, each of the voltage generating circuit 220, the row decoder 230, and the page buffer 250 of the peripheral circuit structure 200 may include a high-voltage transistor.

Figure 2A:
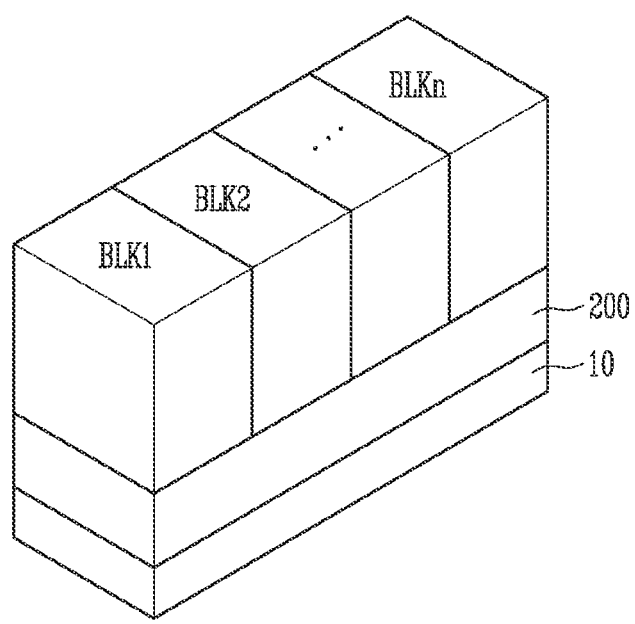
FIG. 2A is a view schematically illustrating a semiconductor memory device according to an embodiment of the present disclosure.

FIG. 2A is a view schematically illustrating a semiconductor memory device according to an embodiment of the present disclosure.

Referring to FIGS. 1 and 2A, the peripheral circuit structure 200 may be disposed on a semiconductor substrate 10. The memory cell array 100 may include a plurality of memory blocks BLK1 to BLKn (where n is a natural number equal to or greater than 2). The plurality of memory blocks BLK1 to BLKn may overlap the peripheral circuit structure 200.

In an embodiment, the semiconductor substrate 10, the peripheral circuit structure 200, and the memory blocks BLK1 to BLKn may be stacked in the reverse order to the order of FIG. 2A. In this case, the peripheral circuit structure 200 may be disposed on the memory blocks BLK1 to BLKn.

The semiconductor substrate 10 may be a single-crystal semiconductor layer. In an embodiment, the semiconductor substrate 10 may include silicon.

The row decoder 230, the column decoder 260, the page buffer 250, and the control circuit 210 of the peripheral circuit structure 200 may control the plurality of memory blocks BLK1 to BLKn. For example, the peripheral circuit structure 200 may include an NMOS transistor, a PMOS transistor, a resistor, a capacitor, etc. which are electrically connected to the memory blocks BLK1 to BLKn. The memory cell array 100 and the peripheral circuit structure 200 may be electrically connected to each other through connection structures. In an embodiment, a first structure including the peripheral circuit structure 200 and a second structure including the memory cell array 100 may be provided through separate manufacturing processes, and the first structure and the second structure may be connected to each other through a bonding process. According to this, the first structure including the peripheral circuit structure 200 may prevent reliability from being compromised due to a high-temperature thermal process occurring during a manufacturing process of providing the memory cell array 100.

Figure 2B:
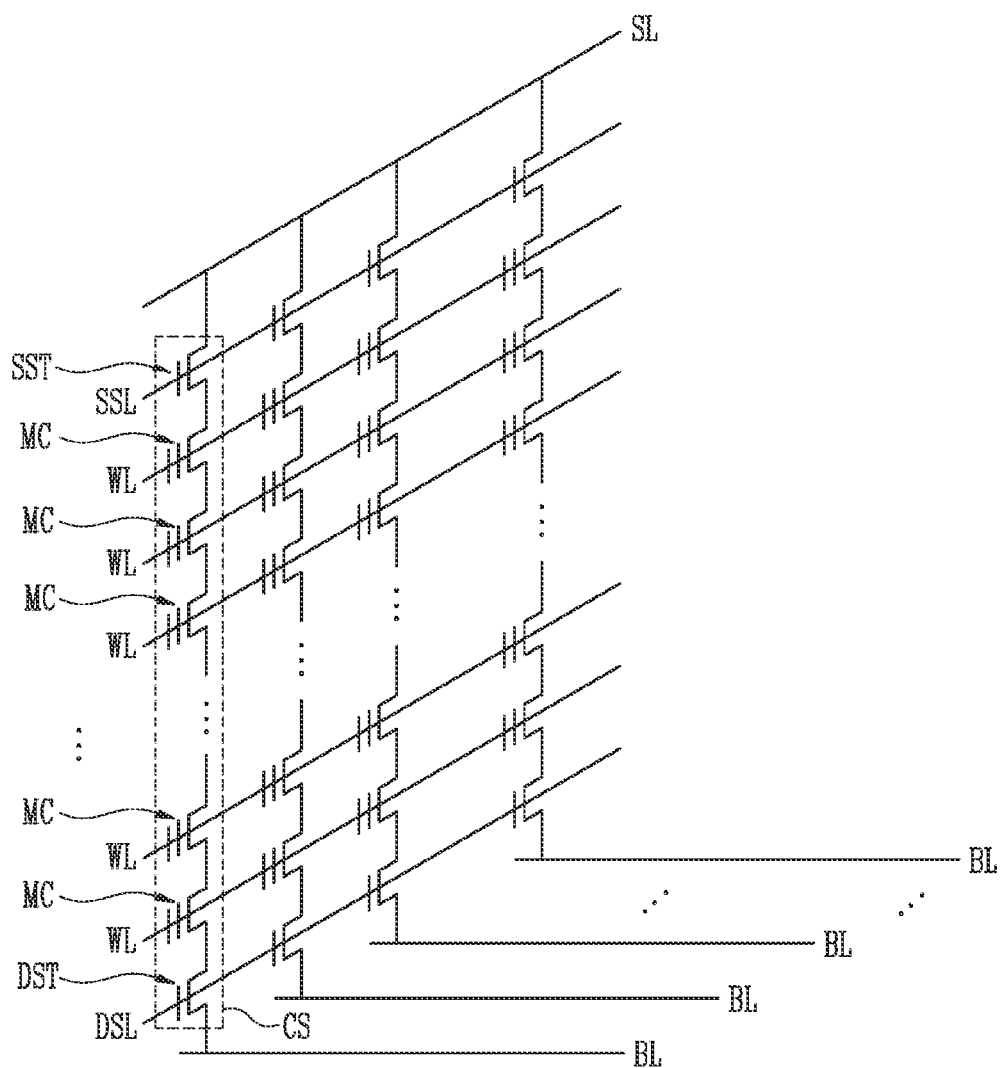
FIG. 2B is a circuit diagram illustrating a memory block according to an embodiment of the present disclosure.

FIG. 2B is a circuit diagram illustrating a memory block according to an embodiment of the present disclosure.

Referring to FIGS. 2A and 2B, each of the memory blocks BLK1 to BLKn may include a plurality of cell strings CS for a NAND flash device. The plurality of cell strings CS may be coupled in parallel to a source structure SL. The plurality of cell strings CS may be coupled to a plurality of bit lines BL, respectively. Each of the cell strings CS may be coupled to the common source line CSL illustrated in FIG. 1 through the source structure SL.

Each of the cell strings CS may include at least one drain select transistor DST, a plurality of memory cells MC, and at least one source select transistor SST. The plurality of memory cells MC may be coupled in series between the drain select transistor DST and the source select transistor SST. The plurality of memory cells MC may be coupled to the source structure SL via the source select transistor SST. The plurality of memory cells MC may be coupled to the corresponding bit line BL via the drain select transistor DST.

The plurality of memory cells MC may be coupled to a plurality of word lines WL, respectively. The drain select transistor DST may be coupled to a drain select line DSL, and the source select transistor SST may be coupled to a source select line SSL. The drain select transistor DST, the plurality of memory cells MC, and the source select transistor SST of each of the cell strings CS may be coupled in series to each other through a channel structure coupled between the source structure SL and the bit line BL. The drain select line DSL and the source select line SSL may be used as respective gates of the drain select transistor DST and the source select transistor SST, and the word lines WL may be used as respective gates of the memory cells MC corresponding thereto.

Figure 3:
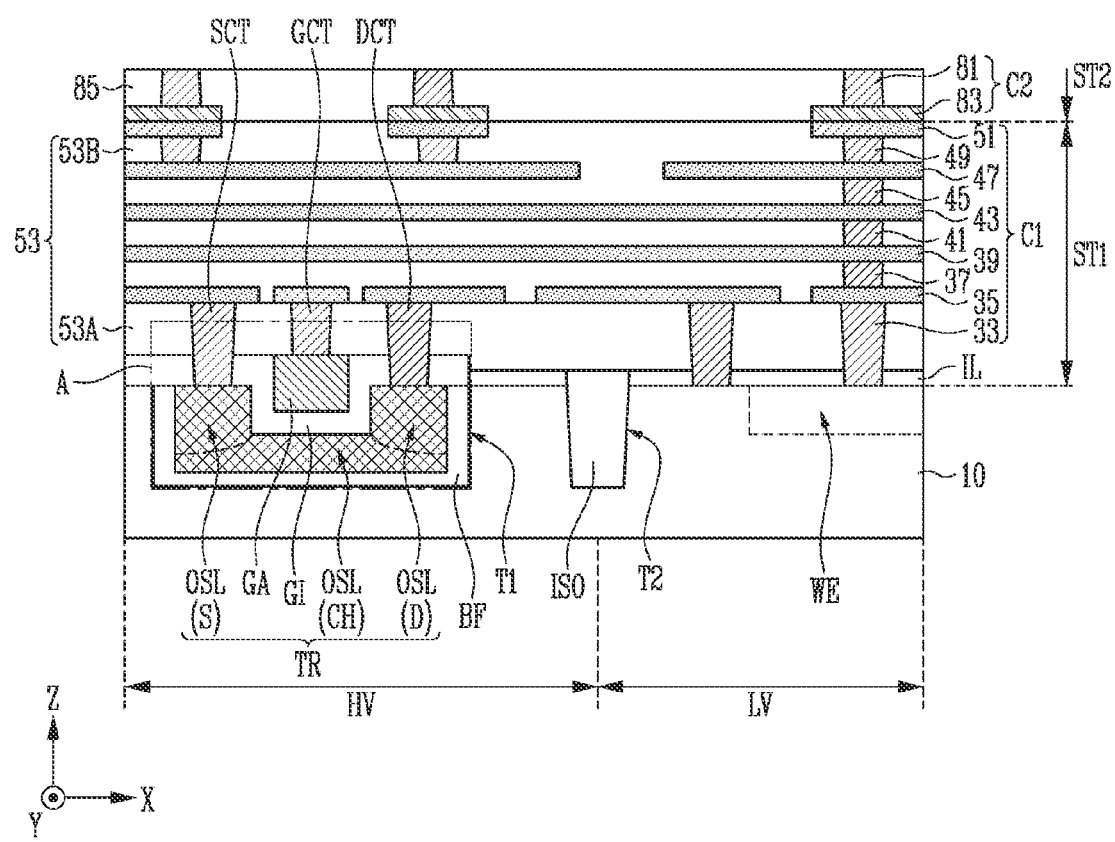
FIG. 3 is a sectional view illustrating a portion of a semiconductor memory device according to an embodiment of the present disclosure.
Figure 4:
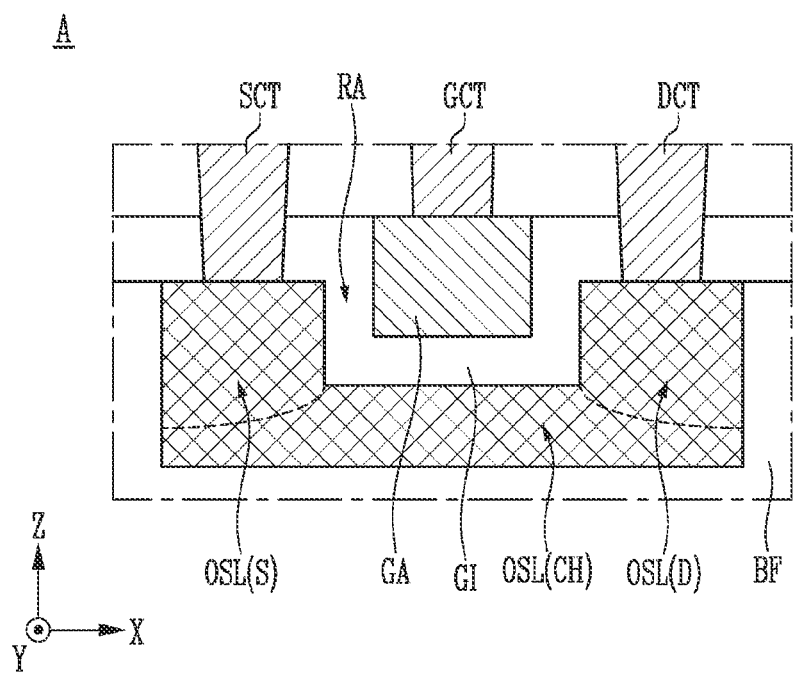
FIG. 4 is an enlarged view of an area A illustrated in FIG. 3 and an enlarged sectional view of a high-voltage transistor.

FIG. 3 is a sectional view illustrating a portion of a semiconductor memory device according to an embodiment of the present disclosure. FIG. 4 is an enlarged view of an area A illustrated in FIG. 3 and is an enlarged sectional view of a high-voltage transistor.

Referring to FIGS. 3 and 4, the semiconductor memory device may include a first structure ST1 and a second structure ST2 coupled to each other. The first structure ST1 may include a semiconductor substrate 10 and the peripheral circuit structure 200, described above with reference to FIGS. 1 and 2A. The peripheral circuit structure 200 may include a high-voltage transistor TR and a low-voltage transistor (not illustrated). The high-voltage transistor TR and the low-voltage transistor may be disposed on the semiconductor substrate 10.

The semiconductor substrate 10 may correspond to the semiconductor substrate 10 illustrated in FIG. 2A. The semiconductor substrate 10 may include a first area HV and a second area LV. An isolation layer ISO may be disposed in the semiconductor substrate 10 at a boundary between the first area HV and the second area LV of the semiconductor substrate 10.

The first area HV of the semiconductor substrate 10 may be a high-voltage area in which the high-voltage transistor TR is arranged, and the second area LV of the semiconductor substrate 10 may be a low-voltage area in which the low-voltage transistor is arranged. The first area HV of the semiconductor substrate 10 may include a first trench T1. An oxide semiconductor layer OSL for an active region of the high-voltage transistor TR may be formed in the first trench T1. The oxide semiconductor layer OSL may include a material having an energy band gap greater than that of the semiconductor substrate 10. In an embodiment, the semiconductor substrate 10 may include silicon, and the oxide semiconductor layer OSL may include gallium oxide ($Ga_2O_3$). A composition ratio of gallium (Ga) and oxygen (O) is not limited thereto. $Ga_2O_3$, provided as the oxide semiconductor layer OSL, may have a crystal structure having various phases. In an embodiment, the oxide semiconductor layer OSL may include $Ga_2O_3$ having a beta phase ($\beta$-$Ga_2O_3$).

The oxide semiconductor layer OSL may include a source region S, a drain region D, and a channel region CH between the source region S and the drain region D. The oxide semiconductor layer OSL may be formed in an n type or a p type. In an embodiment, the oxide semiconductor layer OSL may be an n type. Impurities may be distributed in the source region S and the drain region D. Accordingly, the concentration of carriers in the source region S and the drain region D may be higher than that of carriers in the channel region CH. In an embodiment, the source region S and the drain region D may be provided as an n-type region containing impurities having a concentration higher than that of the channel region CH. In this case, impurities containing at least one of silicon (Si) and tin (Sn) may be distributed in the source region S and the drain region D.

When the semiconductor substrate 10 directly contacts the oxide semiconductor layer OSL, a defect site may occur in an interface between the semiconductor substrate 10 and the oxide semiconductor layer OSL due to the difference between lattice constants of the semiconductor substrate 10 and the oxide semiconductor layer OSL. Charges may be trapped in such a defect site. To prevent such a charge trap, a buffer layer BF may be disposed between the oxide semiconductor layer OSL and the semiconductor substrate 10, The buffer layer BF may have a single-layer structure or a bi-layer structure. In an embodiment, the buffer layer BF may include at least one of aluminum oxide ($Al_2O_3$) and silicon dioxide ($SiO_2$). The buffer layer BF might not only prevent charge trapping from occurring on the interface between the semiconductor substrate 10 and the oxide semiconductor layer OSL, but also improve the crystallinity of the oxide semiconductor layer OSL, Accordingly, by means of the buffer layer BF, the operational reliability of the high-voltage transistor TR may be improved. The high-voltage transistor TR may be aligned in the first trench T1. More specifically, the high-voltage transistor TR may include the above-described oxide semiconductor layer OSL, a gate insulating layer GI on the oxide semiconductor layer OSL, and a gate electrode GA on the gate insulating layer GI. The oxide semiconductor layer OSL may be provided as an active region of the high-voltage transistor TR, and may be formed of a material having an energy band gap greater than that of the semiconductor substrate 10, Accordingly, compared to the case where the semiconductor substrate 10 is used as the active region, in the case where the oxide semiconductor layer OSL is used as the active region, the high-voltage transistor TR may have high carrier mobility and a low leakage current, and thus the operational reliability of the high-voltage transistor TR may be improved. The channel region CH of the oxide semiconductor layer OSL may be formed to have a recessed structure between the source region S and the drain region D of the oxide semiconductor layer OSL so that a recess area RA (see FIGS. 5E and 5F) is defined between the source region S and the drain region D.

The gate electrode GA may be disposed to overlap the channel region CH of the oxide semiconductor layer OSL. The source region S and the drain region D of the oxide semiconductor layer OSL may be opened without being blocked by the gate electrode GA on both sides of the gate electrode GA. The gate electrode GA may include a portion disposed in the recess area RA, The isolation layer ISO might not only be disposed in a boundary between the first area HV and the second area LV of the semiconductor substrate 10 but also be formed to define boundaries between a plurality of active regions in each of the first area HV and the second area LV of the semiconductor substrate 10. The isolation layer ISO may be disposed in a second trench T2 of the semiconductor substrate 10, and may contain an insulating material.

The second area LV of the semiconductor substrate 10 may include a well impurity region WE in which well impurities are distributed. The well impurity region WE may include at least one of an n-well region containing n-type impurities and a p-well region containing p-type impurities. Although not illustrated in the drawings, the low-voltage transistor may be disposed in the well impurity region WE.

The first structure ST1 may further include a gate contact GCT, a source contact SCT, and a drain contact DCT. The gate contact GCT may be coupled to the gate electrode GA of the high-voltage transistor TR. The source contact SCT and the drain contact DCT may be coupled to the source region S and the drain region D of the oxide semiconductor layer OSL, respectively, by penetrating the gate insulating layer GI.

The first structure ST1 may further include a substrate insulating layer IL, a conductive first connection structure C1, and a first insulating structure 53. The substrate insulating layer IL may be disposed in the second area LV of the semiconductor substrate 10. The substrate insulating layer IL may be used as a gate insulating layer of the low-voltage transistor. The first connection structure C1 may include a plurality of conductive layers 33, 35, 37, 39, 41, 43, 45, 47, 49, and 51. Some (e.g., conductive layer 51) of the plurality of conductive layers 33, 35, 37, 39, 41, 43, 45, 47, 49, and 51 may be used as a first bonding pad. Some (e.g., conductive layer 33) of the plurality of conductive layers 33, 35, 37, 39, 41, 43, 45, 47, 49, and 51 may be used as a pickup contact coupled to the well impurity region WE or the semiconductor substrate 10. The first insulating structure 53 may cover peripheral circuit elements including the high-voltage transistor TR and the well impurity region WE. In an embodiment, the first insulating structure 53 may include a first insulating layer 53A and an upper insulating structure 53B. The first insulating layer 53A may be disposed on the gate insulating layer GI, and may extend to cover the substrate insulating layer IL. The upper insulating structure 53B may be disposed on the first insulating layer 53A, and may include insulating layers corresponding to two or more layers. The plurality of conductive layers 33, 35, 37, 39, 41, 43, 45, 47, 49, and 51, the gate contact GCT, the source contact SCT, and the drain contact DCT may be disposed in the first insulating structure 53.

The second structure ST2 may include a conductive second connection structure C2 and a second insulating structure 85. The second connection structure C2 may be designed to be coupled to the memory cell array 100, described above with reference to FIG. detail, the second connection structure C2 may be designed to be coupled to cell strings (e.g., CS of FIG. 2B) forming each of the memory blocks BLK1 to BLKn illustrated in FIG. 2A, For example, the second connection structure C2 may be designed to be coupled to the drain select line DSL, the source select line SSL, the plurality of word lines WL, the plurality of bit lines BL, and the source structure SL of each cell string CS illustrated in FIG. 2B. The second connection structure C2 may include a plurality of conductive layers 81 and 83. Some (e.g., conductive layers 83) of the plurality of conductive layers 81 and 83 may be used as a second bonding pad. The conductive layers 83 corresponding to the second bonding pad may be coupled to the conductive layers 51 corresponding to the first bonding pad. The plurality of conductive layers 81 and 83 may be disposed in the second insulating structure 85. The second insulating structure 85 may include insulating layers corresponding to two or more layers.

In accordance with an embodiment of the present disclosure, by means of the high-voltage transistor TR including the oxide semiconductor layer CSL, the thermal stability of the high-voltage transistor TR and the charge mobility of the channel region CH may be improved, and the current on/off ratio of the high-voltage transistor TR may be increased. Thus, an embodiment of the present disclosure nay Improve the operational reliability of the high-voltage transistor TR included in the CMOS device and charge mobility of the channel region CH may be improved, and may also enhance the operational reliability of the semiconductor memory device controlled by the high-voltage transistor TR.

FIGS. 5A to 5I are sectional views for describing a method of manufacturing a complementary metal oxide semiconductor (CMOS) device according to an embodiment of the present disclosure. Using the processes illustrated in FIGS. 5A to 5I, the first structure, described above with reference to FIGS. 3 and 4, may be provided. Hereinafter, repeated descriptions of components already described above with reference to FIGS. 3 and 4 will be omitted.

Figure 5A:
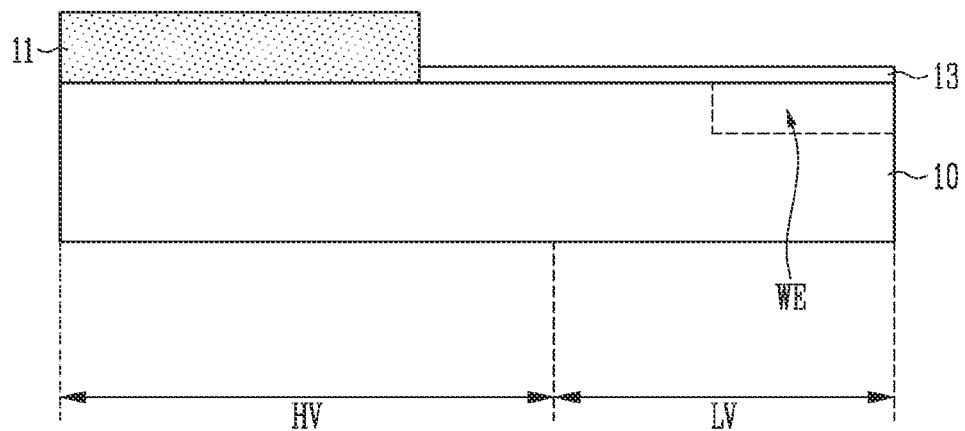
FIGS. 5A to 5I are sectional views for describing a method of manufacturing a complementary metal oxide semiconductor (CMOS) device according to an embodiment of the present disclosure.

Referring to FIG. 5A, a first mask layer 11 may be formed on a semiconductor substrate 10 including a first area HV and a second area LV. The first mask layer 11 may be disposed in the first area HV to open the second area LV of the semiconductor substrate 10. Then, at least one of n-type impurities and p-type impurities may be implanted into the second area LV of the semiconductor substrate 10 so that a well impurity region WE may be defined in the second area LV.

Subsequently, a substrate insulating layer 13 may be formed in a partial area of the semiconductor substrate 10 opened by the first mask layer 11. The substrate insulating layer 13 may be formed by oxidizing the partial area of the semiconductor substrate 10 opened by the first mask layer 11. A process of manufacturing the substrate insulating layer 13 is not limited thereto. In an embodiment, after the substrate insulating layer 13 is applied on the semiconductor substrate 10, a portion of the substrate insulating layer 13 may be removed such that the first area HV is exposed. The substrate insulating layer 13 may include an oxide layer such as a silicon oxide layer. The substrate insulating layer 13 may correspond to the substrate insulating layer IL illustrated in FIG. 3.

Figure 5B:
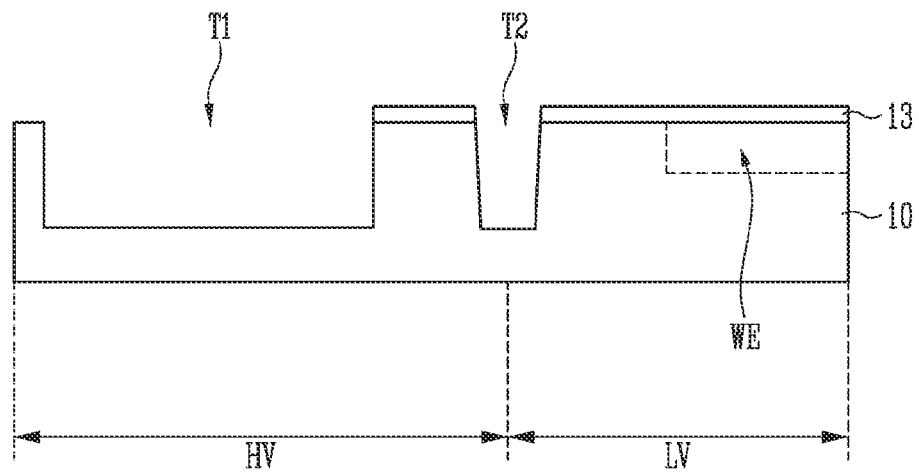

Referring to FIG. 5B, after the first mask layer 11 illustrated in FIG. 5A is removed, a portion of the first area HV of the semiconductor substrate 10 may be etched. In this way, a first trench T1 may be formed in the first area HV of the semiconductor substrate 10. When the first trench T1 is formed, a second trench T2 may be formed. The second trench T2 may be formed at a boundary between the first area HV and the second area LV. In an embodiment, the first trench T1 and the second trench T2 may be formed through separate etching processes.

The first trench T1 may define an active region of the first area HV. The second trench T2 may electrically disconnect the first area HV and the second area LV from each other. In an embodiment, a dry etching process may be used to form the first trench T1 and the second trench T2. For example, after a mask pattern (not illustrated) including openings is formed on the semiconductor substrate 10, the substrate insulating layer 13 and the semiconductor substrate 10, which are exposed through the mask pattern (not illustrated), may be etched. Therefore, the first and second trenches T1 and T2 may be formed. After the first and second trenches T1 and T2 are formed, the mask pattern (not illustrated) may be removed.

Figure 5C:
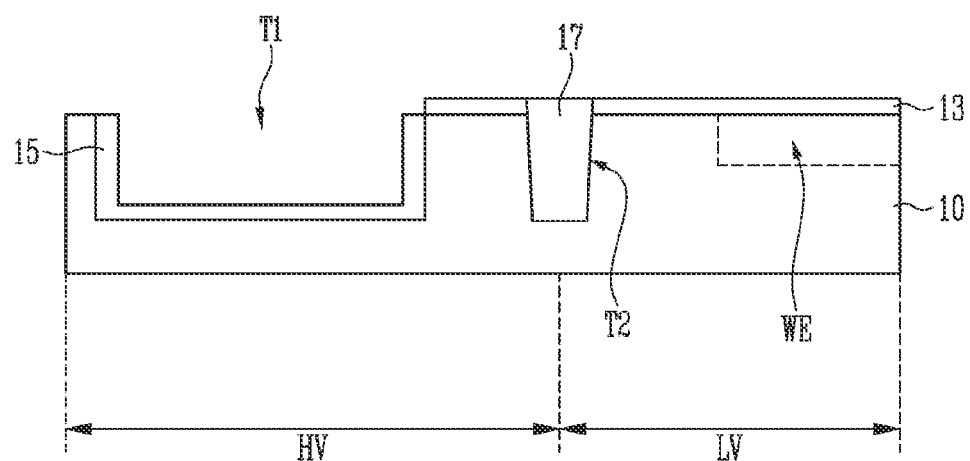

Referring to FIG. 5C, a buffer layer 15 may be formed in the first trench T1. The buffer layer 15 may be formed along the surface of the first trench T1. The buffer layer 15 may correspond to the buffer layer BF illustrated in FIGS. 3 and 4. The buffer layer 15 may include at least one of an aluminum oxide and a silicon oxide. In an embodiment, the aluminum oxide may be $Al_2O_3$, and the silicon oxide may be $SiO_2$.

An isolation layer 17 may be formed in the second trench T2 illustrated in FIG. 5B. The Isolation layer 17 may correspond to the isolation layer ISO illustrated in FIG. 3, The isolation layer 17 may include an insulating material. In an embodiment, the isolation layer 17 may include silicon oxide. In an embodiment, when each of the buffer layer 15 and the isolation layer 17 is formed of silicon oxide, the buffer layer 15 and the isolation layer 17 may be simultaneously formed. In an embodiment, when the buffer layer 15 includes aluminum oxide, the buffer layer 15 and the isolation layer 17 may be formed through different processes. In this case, the buffer layer 15 outside the first trench T1 and the isolation layer 17 outside the second trench T2 may be removed through respective etching processes.

Figure 5D:
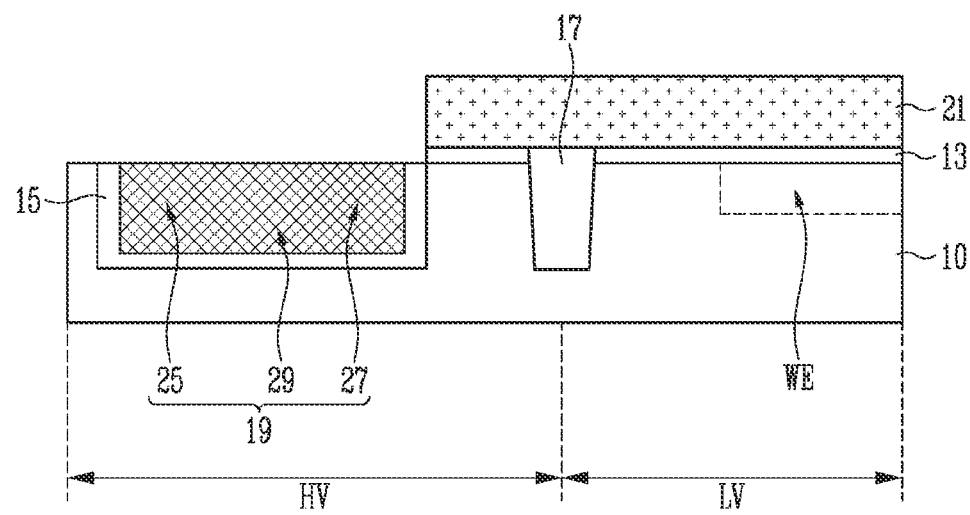

Referring to FIG. 5D, a second mask layer 21 may be formed on the substrate insulating layer 13. Subsequently, an oxide semiconductor layer 19 may be formed on the buffer layer 15. The oxide semiconductor layer 19 may correspond to the oxide semiconductor layer OSL, described above with reference to FIGS. 3 and 4. The oxide semiconductor layer 19 may be disposed in the first trench (e.g., T1 of FIG. 5C) opened by the buffer layer 15. In other words, the oxide semiconductor layer 19 may be formed in an area enclosed by the buffer layer 15. The oxide semiconductor layer 19 may include gallium oxide. For example, gallium oxide may be $Ga_2O_3$. The phases of gallium oxide ($Ga_2O_3$) may be divided into alpha, beta, gamma, delta, epsilon, etc. depending on the growth condition. $Ga_2O_3$ having the beta phase, among the phases, may have a conductivity higher than that of $Ga_2O_3$ having other phases, and may show the most stable electrical characteristics at high temperature. The oxide semiconductor layer 19 according to an embodiment of the present disclosure may include $Ga_2O_3$ having the beta phase to improve the operational stability of the high-voltage transistor. The composition ratio of Ga and O of gallium oxide is not limited to $Ga_2O_3$, The oxide semiconductor layer 19 may be formed through chemical vapor deposition (CVD) or atomic layer deposition (ALD).

The oxide semiconductor layer 19 may include a source region 25, a drain region 27, and a channel region 29 between the source region 25 and the drain region 27.

Figure 5E:
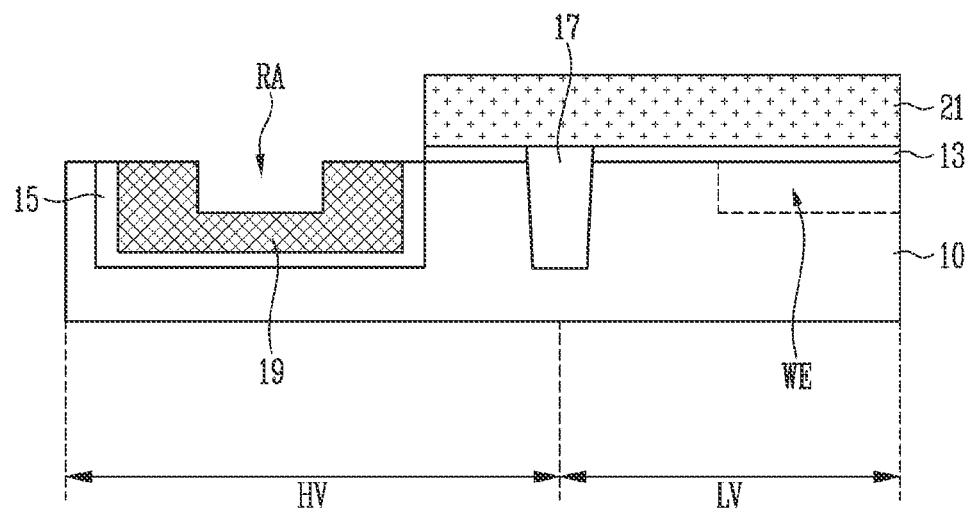

Referring to FIG. 5E, a recess area RA may be formed by etching a portion of the oxide semiconductor layer 19. The recess area RA may be formed by etching a portion of the channel region 29, illustrated in FIG. 5D, between the source region 25 and the drain region 27 illustrated in FIG. 5D, An etching process for the recess area RA may be performed using a method similar to the etching process for forming the first trench T1 of FIG. 5B. For example, after a mask pattern (not illustrated) which exposes a portion of the oxide semiconductor layer 19 is formed on the entire structure including the oxide semiconductor layer 19, a portion of the oxide semiconductor layer 19, exposed through the opening of the mask pattern (not illustrated), may be etched. In this way, the recess area RA may be formed. In an embodiment, the etching process may be performed as a dry etching process. The etching process may be controlled such that a channel region defining a bottom surface of the recess area RA remains. After the recess area RA is formed, the mask pattern (not illustrated) may be removed.

Figure 5F:
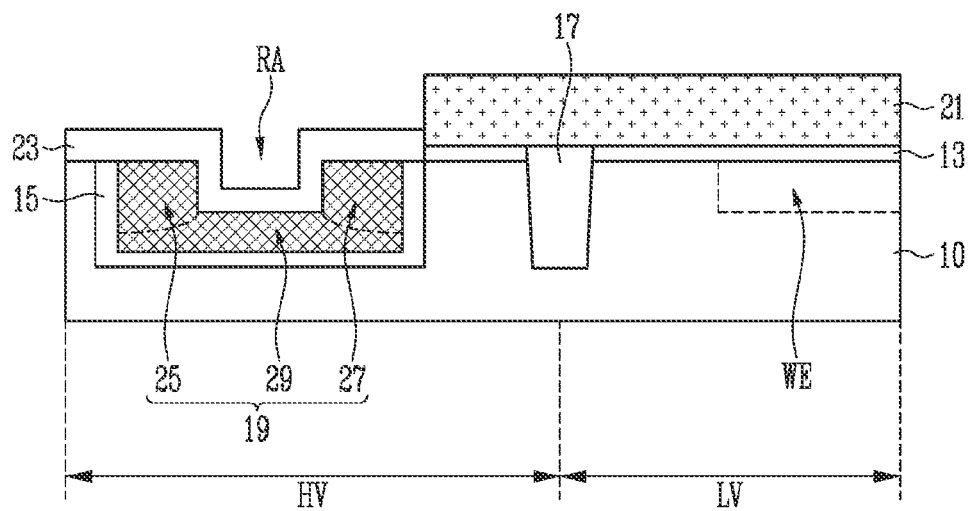

Referring to FIG. 5F, a gate insulating layer 23 may be formed on the oxide semiconductor layer 19. The gate insulating layer 23 may correspond to the gate insulating layer GI illustrated in FIGS. 3 and 4. The gate insulating layer 23 may extend to the first area HV of the semiconductor substrate 10, For example, the gate insulating layer 23 may be formed along respective surfaces of the semiconductor substrate 10, the buffer layer 15, and the oxide semiconductor layer 19, which are exposed in the first area HV.

The substrate insulating layer 13 may be used as the gate insulating layer of the low-voltage transistor in the second area LV. The thickness of the gate insulating layer 23 of the high-voltage transistor may be greater than that of the substrate insulating layer 13 used as the gate insulating layer of the low-voltage transistor. In this way, the breakdown voltage of the gate insulating layer 23 may be increased.

Then, an ion implantation process of implanting impurities into the source region 25 and the drain region 27 of the oxide semiconductor layer 19 may be performed.

Figure 5G:
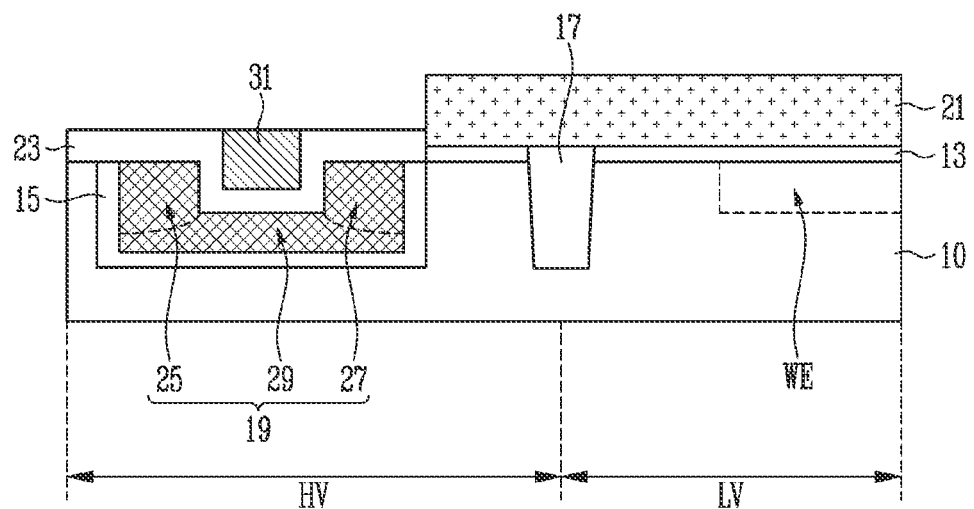

Referring to FIG. 5G, a gate electrode 31 may be formed on the gate insulating layer 23. The gate electrode 31 may correspond to the gate electrode GA illustrated in FIGS. 3 and 4, The gate electrode 31 may be formed to overlap the channel region 29 of the oxide semiconductor layer 19. The gate electrode 31 may include a portion disposed in the recess area RA illustrated in FIG. 5F. In other words, the gate electrode 31 may include a portion enclosed by the gate insulating layer 23 on the gate insulating layer 23. In an embodiment, a process of forming the gate electrode 31 may include the step of forming a conductive layer on the gate insulating layer 23 to fill the recess area RA illustrated in FIG. 5F and the step of planarizing the conductive layer so that a portion of the gate insulating layer 23 is exposed.

The source region 25 may be adjacent to one side of the gate electrode 31, and the drain region 27 may be adjacent to the other side of the gate electrode 31.

Figure 5H:
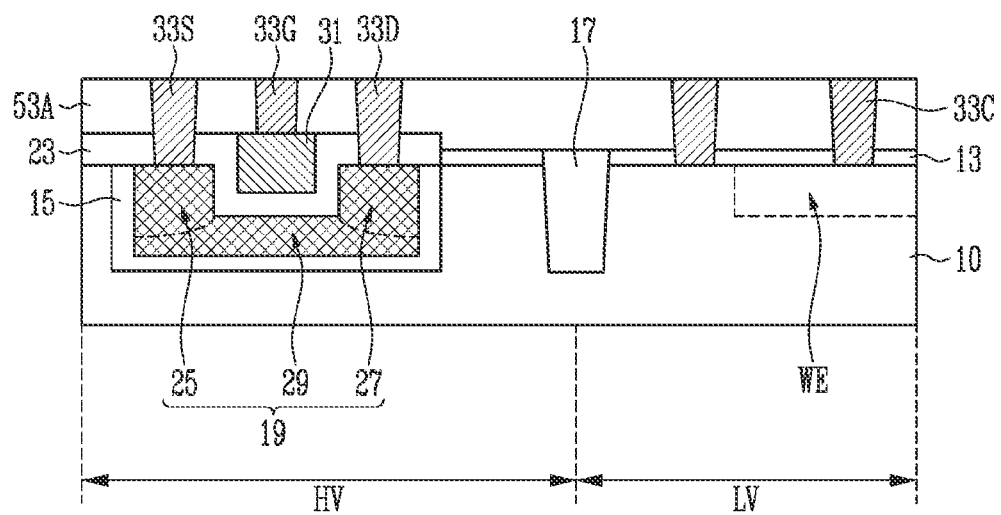

Referring to FIG. 5H, the second mask layer 21 illustrated in FIG. 5G may be removed. Thereafter, a first insulating layer 53A of the first insulating structure may be formed. The first insulating layer 53A may extend to cover the gate insulating layer 23 and the substrate insulating layer 13.

Subsequently, a plurality of conductive layers 33C, 33G, 33S, and 33D penetrating the first insulating layer 53A may be formed. In an embodiment, the plurality of first conductive layers may include a gate contact 33G coupled to the gate electrode 31, a source contact 33S coupled to the source region 25 of the oxide semiconductor layer 19, a drain contact 33D coupled to the drain region 27 of the oxide semiconductor layer 19, and pickup contacts 33C respectively coupled to the well impurity region WE and the second area LV of the semiconductor substrate 10. The pickup contacts 33C may penetrate the substrate insulating layer 13, and the source contact 33S and the drain contact 33D may penetrate the gate insulating layer 23. The source contact 33S, the drain contact 33D, and the pickup contacts 33C may correspond to conductive layers designated as reference numerals SCT, DCT, and 33, respectively, in FIG. 3.

Figure 5I:
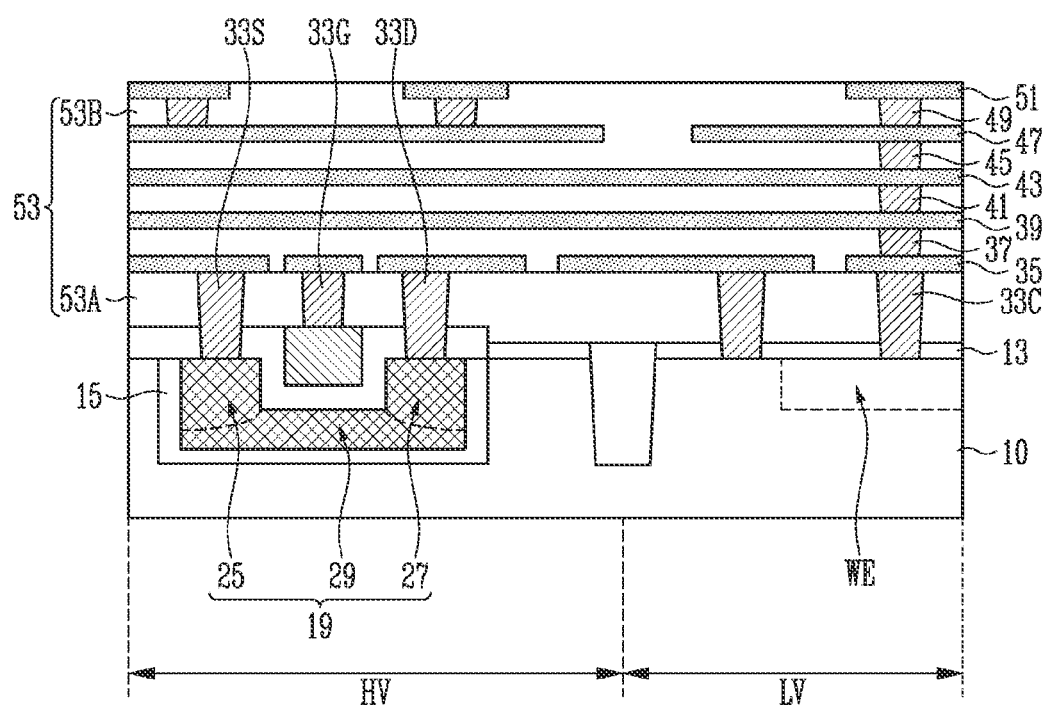

Referring to FIG. 5I, a plurality of conductive layers 35, 37, 39, 41, 43, 45, 47, 49, and 51 and an upper insulating structure 53B of the first insulating structure 53 may be formed. The plurality of conductive layers 35, 37, 39, 41, 43, 45, 47, 49, and 51 may be disposed in the upper insulating structure 53B. The upper insulating structure 53B may include insulating layers, corresponding to two or more layers, stacked on the first insulating layer 53A.

An embodiment of the present disclosure may improve the operational reliability of a high-voltage transistor included in a CMOS device through a high-voltage transistor including an oxide semiconductor, and may improve the operational reliability of a semiconductor memory device controlled by the high-voltage transistor.

What is claimed is:

1. A complementary metal oxide semiconductor (CMOS) device, comprising:
   a semiconductor substrate;
   a trench formed in the semiconductor substrate;
   an oxide semiconductor layer disposed in the trench, the oxide semiconductor layer including a source region, a drain region, and a channel region between the source region and the drain region;
   a buffer layer between the oxide semiconductor layer and the semiconductor substrate;
   a gate insulating layer on the oxide semiconductor layer;
   a gate electrode disposed on the gate insulating layer over the channel region of the oxide semiconductor layer; and
   impurities distributed in each of the source region and the drain region of the oxide semiconductor layer.

2. The CMOS device according to claim 1, wherein the semiconductor substrate comprises a first area including the trench and a second area doped with well impurities.

3. The CMOS device according to claim 2, further comprising:
   an isolation layer disposed in the semiconductor substrate at a boundary between the first area and the second area.

4. The CMOS device according to claim 1, wherein the oxide semiconductor layer includes a material having an energy band gap greater than an energy band gap of the semiconductor substrate.

5. The CMOS device according to claim 4, wherein:
   the semiconductor substrate includes silicon, and
   the oxide semiconductor layer includes gallium oxide ($Ga_2O_3$).

6. The CMOS device according to claim 1, wherein the buffer layer includes at least one of aluminum oxide ($Al_2O_3$) and silicon dioxide ($SiO_2$).

7. The CMOS device according to claim 1, wherein the oxide semiconductor layer includes gallium oxide ($Ga_2O_3$).

8. The CMOS device according to claim 1, wherein the oxide semiconductor layer includes gallium oxide ($Ga_2O_3$) having a beta phase.

9. The CMOS device according to claim 1, wherein the channel region has a recessed structure between the source region and the drain region of the oxide semiconductor layer such that a recess area is defined between the source region and the drain region.

10. The CMOS device according to claim 9, wherein the gate electrode includes a portion disposed in the recess area on the gate insulating layer.

11. A semiconductor memory device, comprising:
    a peripheral circuit structure including a transistor aligned in a trench in a semiconductor substrate;
    a conductive first connection structure coupled to the peripheral circuit structure and including a first bonding pad;
    a conductive second connection structure including a second bonding pad coupled to the first bonding pad; and
    a memory cell array coupled to the conductive second connection structure,
    wherein the transistor comprises:
    an oxide semiconductor layer disposed in the trench, the oxide semiconductor layer including a source region, a drain region, and a channel region between the source region and the drain region;
    a buffer layer between the oxide semiconductor layer and the semiconductor substrate;
    a gate insulating layer on the oxide semiconductor layer;
    a gate electrode disposed on the gate insulating layer over the channel region of the oxide semiconductor layer; and
    impurities distributed in each of the source region and the drain region of the oxide semiconductor layer.

12. The semiconductor memory device according to claim 11, wherein the semiconductor substrate comprises a first area including the trench and a second area doped with well impurities.

13. The semiconductor memory device according to claim 12, wherein the peripheral circuit structure further comprises:
    an isolation layer disposed in the semiconductor substrate at a boundary between the first area and the second area.

14. The semiconductor memory device according to claim 11, wherein the buffer layer includes at least one of aluminum oxide ($Al_2O_3$) and silicon dioxide ($SiO_2$).

15. The semiconductor memory device according to claim 11, wherein the oxide semiconductor layer includes gallium oxide ($Ga_2O_3$).

16. The semiconductor memory device according to claim 11, wherein the oxide semiconductor layer includes gallium oxide ($Ga_2O_3$) having a beta phase.

17. A method of manufacturing a CMOS device, comprising:
    forming a trench in a first area of a semiconductor substrate including the first area and a second area;
    forming a buffer layer along a surface of the trench;
    forming an oxide semiconductor layer on the buffer layer in the trench, the oxide semiconductor layer including a source region, a drain region, and a channel region between the source region and drain region;
    forming a gate insulating layer on the oxide semiconductor layer;
    implanting impurities into the source region and the drain region of the oxide semiconductor layer; and
    forming a gate electrode on the gate insulating layer over the channel region of the oxide semiconductor layer.

18. The method according to claim 17, further comprising:
    forming an isolation layer in the semiconductor substrate at a boundary between the first area and the second area; and
    implanting well impurities into the second area of the semiconductor substrate.

19. The method according to claim 17, further comprising:
    forming, before the gate insulating layer is formed, a recess area by etching a portion of the channel region between the source region and the drain region of the oxide semiconductor layer,
    wherein the gate insulating layer is formed along a surface of the recess area, and
    wherein the gate electrode includes a portion disposed in the recess area on the gate insulating layer.

20. The method according to claim 17, wherein the oxide semiconductor layer is formed to include a material having an energy band gap greater than an energy band gap of the semiconductor substrate.

21. The method according to claim 20, wherein:
    the semiconductor substrate includes silicon, and
    the oxide semiconductor layer is formed to include gallium oxide ($Ga_2O_3$).

22. The method according to claim 17, wherein:
the buffer layer is formed to include at least one of aluminum oxide ($Al_2O_3$) and silicon dioxide ($SiO_2$), and
the oxide semiconductor layer is formed to include gallium oxide ($Ga_2O_3$) having a beta phase.

\* \* \* \* \*